US012120923B2

(12) United States Patent
Chen et al.

(10) Patent No.: US 12,120,923 B2
(45) Date of Patent: Oct. 15, 2024

(54) DISPLAY DEVICE AND METHOD FOR MANUFACTURING SAME

(71) Applicant: Wuhan China Star Optoelectronics Semiconductor Display Technology Co., Ltd., Wuhan (CN)

(72) Inventors: Yungsheng Chen, Wuhan (CN); Qian Jiang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/267,901

(22) PCT Filed: Oct. 20, 2020

(86) PCT No.: PCT/CN2020/122072
§ 371 (c)(1),
(2) Date: Feb. 11, 2021

(87) PCT Pub. No.: WO2022/052216
PCT Pub. Date: Mar. 17, 2022

(65) Prior Publication Data
US 2023/0189571 A1    Jun. 15, 2023

(30) Foreign Application Priority Data

Sep. 8, 2020    (CN) .......................... 202010936674.8

(51) Int. Cl.
*H10K 59/122*    (2023.01)
*H10K 59/12*    (2023.01)
(Continued)

(52) U.S. Cl.
CPC ....... *H10K 59/122* (2023.02); *H10K 59/1201* (2023.02); *H10K 59/873* (2023.02); *H10K 71/00* (2023.02)

(58) Field of Classification Search
None
See application file for complete search history.

(56) References Cited

U.S. PATENT DOCUMENTS

| 2002/0030443 A1* | 3/2002 | Konuma | H10K 71/00 |
| | | | 313/504 |
| 2005/0062052 A1* | 3/2005 | Yang | H10K 59/873 |
| | | | 257/40 |

(Continued)

FOREIGN PATENT DOCUMENTS

| CN | 108091634 A | 5/2018 |
| CN | 108364987 A | 8/2018 |

(Continued)

*Primary Examiner* — Evren Seven
(74) *Attorney, Agent, or Firm* — Nathan & Associates; Menachem Nathan

(57) ABSTRACT

The present application provides a display device and a method for manufacturing the display device. The display device includes a display region and a non-display region. The display device includes an array substrate, a planarization layer, a pixel defining layer, and a protective layer. The planarization layer is disposed on the array substrate. The pixel defining layer is located in the display region. The pixel defining layer is disposed on the planarization layer. The protective layer is located in the non-display region. The protective layer is disposed on the planarization layer.

7 Claims, 2 Drawing Sheets

(51) Int. Cl.
*H10K 59/80* (2023.01)
*H10K 71/00* (2023.01)

(56) References Cited

U.S. PATENT DOCUMENTS

| | | | | |
|---|---|---|---|---|
| 2016/0307971 | A1* | 10/2016 | Jeon | G09G 3/3233 |
| 2017/0053973 | A1* | 2/2017 | Park | H10K 50/844 |
| 2017/0237038 | A1* | 8/2017 | Kim | H10K 77/10 |
| | | | | 257/40 |
| 2017/0288004 | A1* | 10/2017 | Kim | H10K 77/10 |
| 2017/0329216 | A1* | 11/2017 | Jung | H10K 71/00 |
| 2017/0331058 | A1* | 11/2017 | Seo | H10K 59/50 |
| 2017/0365814 | A1* | 12/2017 | Kim | H10K 50/8445 |
| 2018/0102502 | A1* | 4/2018 | Kim | H01L 22/12 |
| 2020/0395573 | A1 | 12/2020 | Zhang et al. | |
| 2023/0180582 | A1* | 6/2023 | Pu | H10K 50/844 |
| | | | | 257/40 |

FOREIGN PATENT DOCUMENTS

| | | | |
|---|---|---|---|
| CN | 108766983 | A | 11/2018 |
| CN | 108878480 | A | 11/2018 |
| KR | 20180112920 | A | 10/2018 |

* cited by examiner

DISPLAY DEVICE AND METHOD FOR MANUFACTURING SAME

BACKGROUND OF INVENTION

Field of Invention

The present application relates to the field of display technology, and particularly to a display device and a method for manufacturing the display device.

Description of Prior Art

In recent years, organic light emitting diode display devices have attracted attention of most practitioners in the industry with their unique advantages. In the field of small and medium-sized displays, there is a trend to replace liquid crystal display panels. Organic light emitting diode panels in the current stage mostly rely on an evaporation process. Among them, a fixture used for pattern definition in the evaporation process is a metal mask. However, since an opening is formed in the metal mask after an etching process, and the opening is in direct contact with a base substrate, scratches are thereby caused on the base substrate. Therefore, foreign objects generated by the scratches may result in poor reliability of products in subsequent processes, and a half-etched design will increase an uneven film thickness in an edge area, which is not conducive to achieving a narrow frame.

SUMMARY OF INVENTION

The present application provides a display device and a method for manufacturing the display device to solve a problem of scratching a base substrate in the prior art.

The present application provides a display device, the display device includes a display region and a non-display region, and the display device further includes:
  an array substrate;
  a planarization layer disposed on the array substrate;
  a passivation layer covering the planarization layer;
  a pixel defining layer located in the display region, wherein the pixel defining layer is disposed on the passivation layer; and
  a protective layer located in the non-display region, wherein the protective layer is disposed on the planarization layer.

In the display device of the present application, the protective layer is made of diamond-like carbon.

In the display device of the present application, a thickness of the protective layer ranges from 3 nanometers to 980 nanometers.

In the display device of the present application, the display device further includes a supporting structure, the supporting structure is disposed on the pixel defining layer.

In the display device of the present application, the display device further includes a barricade, the non-display region comprises a first region and a second region, the first region is located near the pixel defining layer, the second region is located away from the pixel defining layer, the barricade is disposed on the planarization layer in the second region, the protective layer covers the barricade, a sum of a height of the barricade and a thickness of the protective layer is greater than a height of the supporting structure.

In the display device of the present application, the display device further includes a cathode contact layer, the cathode contact layer is disposed on the planarization layer in the first region.

The present application further provides a display device, the display device includes a display region and a non-display region, and the display device further includes:
  an array substrate;
  a planarization layer disposed on the array substrate;
  a pixel defining layer located in the display region, wherein the pixel defining layer is disposed on the planarization layer; and
  a protective layer located in the non-display region, wherein the protective layer is disposed on the planarization layer.

In the display device of the present application, the protective layer is made of diamond-like carbon.

In the display device of the present application, a thickness of the protective layer ranges from 3 nanometers to 980 nanometers.

In the display device of the present application, the display device further includes a supporting structure, the supporting structure is disposed on the pixel defining layer.

In the display device of the present application, the display device further includes a barricade, the non-display region comprises a first region and a second region, the first region is located near the pixel defining layer, the second region is located away from the pixel defining layer, the barricade is disposed on the planarization layer in the second region, the protective layer covers the barricade, and a sum of a height of the barricade and a thickness of the protective layer is greater than a height of the supporting structure.

In the display device of the present application, the display device further includes a cathode contact layer, the cathode contact layer is disposed on the planarization layer in the first region.

In the display device of the present application, the display device further includes a segregating layer, the segregating layer is disposed on the cathode contact layer.

In the display device of the present application, the display device further includes a dam, the dam is disposed on the planarization layer in the second region.

In the display device of the present application, the display device further includes a crack blocking dam, the crack blocking dam is disposed on the planarization layer in the second region.

The present application further provides a method for manufacturing a display device, the display device includes a display region and a non-display region, and the method for manufacturing the display device includes steps of:
  providing an array substrate;
  stacking a planarization layer and a pixel defining layer on the array substrate in sequence, wherein the pixel defining layer is located in the display region; and
  disposing a protective layer on the planarization layer in the non-display region.

In the method for manufacturing the display device of the present application, after the step of stacking the planarization layer and the pixel defining layer on the array substrate and before the step of disposing the protective layer on the planarization layer in non-display region, the method further includes:
  disposing a covering layer on the pixel defining layer and the planarization layer in the display region.

In the method for manufacturing the display device of the present application, the covering layer is made of one or a group selected from polyester, SiOx, and SiNx.

In the method for manufacturing the display device of the present application, the covering layer is a metal mask.

In the method for manufacturing the display device of the present application, after the step of stacking the planarization layer and the pixel defining layer on the array substrate in sequence, wherein the pixel defining layer is located in the display region and before the step of disposing the protective layer on the planarization layer in non-display region, the method further includes:

disposing and etching a supporting structure material on the pixel defining layer to form a supporting structure.

The benefit of the present application is: the present application provides a display device and a method for manufacturing the display device. The display device includes a display region and a non-display region. The display device includes an array substrate, a planarization layer, a pixel defining layer, and a protective layer. The planarization layer is disposed on the array substrate. The pixel defining layer is located in the display region. The pixel defining layer is disposed on the planarization layer. The protective layer is located in the non-display region. The protective layer is disposed on the planarization layer. In the present application, the protective layer is disposed on the planarization layer in the non-display region to prevent water and oxygen from intruding the display device, and prevent the structure in the display device from being scratched without affecting the subsequent manufacturing process, thereby improving the reliability of the display device.

BRIEF DESCRIPTION OF DRAWINGS

In order to explain the technical solutions in this application more clearly, the following will briefly introduce the drawings needed in the description of the embodiments. Obviously, the drawings in the following description are only some embodiments of the application. For those skilled in the art, without creative work, other drawings can be obtained based on these drawings.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all of the embodiments. Based on the embodiments in this application, all other embodiments obtained by those skilled in the art without creative work fall within the protection scope of this application.

Figure 1:
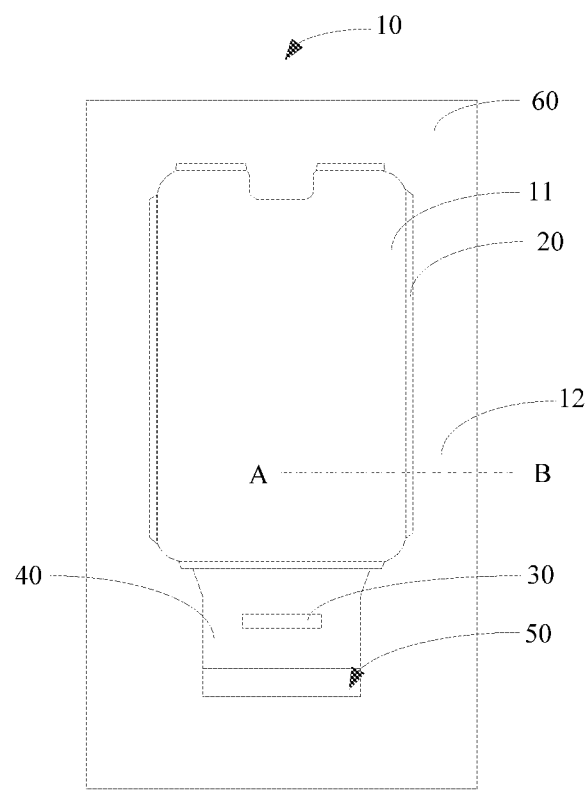
FIG. 1 is a top view of a display device according to the present application.

Referring to FIG. 1, FIG. 1 is a top view of a display device according to the present application. The present application provides a display device 10. The display device 10 includes a display region 11 and a non-display region 12. The non-display region 12 surrounds the display region 11. The display device 10 includes a cathode film layer 20, a driving chip 30, a chip on film 40, a flexible circuit board binding region 50, and protective layer 60. The cathode film layer 20, the driving chip 30, the chip on film 40, the flexible circuit board binding region 50, and the protective layer 60 are located in the non-display region 12. The cathode film layer 20 surrounds the display region 11. The chip on film 40 is connected to the cathode film layer 20. The driving chip 30 is bound to the chip on film 40. The flexible circuit board binding region 50 is disposed on a side of the chip on film 40 away from the cathode film layer 20. The driving chip 30 is disposed on the chip on film 40. The protective layer 60 surrounds the cathode film layer 20, the chip on film 40, and the flexible circuit board binding region 50.

Figure 2:
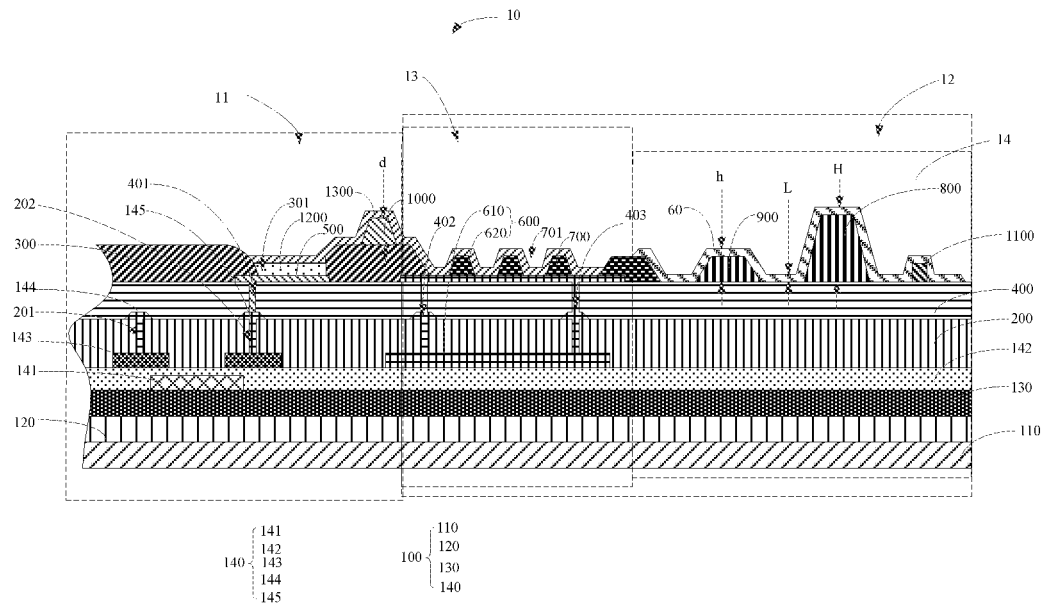
FIG. 2 is a cross-sectional view of the display device according to the present application taken along AB.

Referring to FIG. 2, FIG. 2 is a cross-sectional view of the display device according to the present application taken along AB. The display device 10 includes an array substrate 100, a planarization layer 200, a pixel defining layer 300 and a protective layer 60. The non-display region 12 includes a first region 13 and a second region 14. The first region 13 is located near the pixel defining layer 300. The second region 14 is located away from the pixel defining layer 300.

The array substrate 100 includes a base substrate 110, a shading layer 120, a buffer layer 130, a transistor 140, and a planarization layer 200. The base substrate 110 can be polyimide or glass, etc. The shading layer 120 and the buffer layer 130 are sequentially stacked on the base substrate 110. The transistor 140 is located in the display region 11. The transistor 140 is disposed on the buffer layer 130. The transistor 140 includes a gate electrode 141, a gate electrode insulating layer 142, an active layer 143, a source electrode 144, and a drain electrode 145. The gate electrode 141 is disposed on the buffer layer 130 The gate electrode insulating layer 142 covers the gate electrode 141. The active layer 143 is disposed on the gate electrode insulating layer 142. The source electrode 144 is disposed on a side of the active layer 143 and electrically connected to the active layer 143. The drain electrode 145 is disposed on the other side of the active layer 143, and electrically connected with the active layer 143.

The planarization layer 200 is disposed on the array substrate 100 Specifically, the planarization layer 200 covers the gate electrode insulating layer 142 and the active layer 143. In the display region 11, the planarization layer 200 includes a first through hole 201 and a second through hole 202. The first through hole 201 penetrates the planarization layer 200 to expose a side of the active layer 143. The second through hole 202 penetrates the planarization layer 200 to expose the other side of the active layer 143. The source electrode 144 is filled in the first through hole 201 and electrically connected to the active layer 143 through the first through hole 201. The drain electrode 145 is filled in the second through hole 202 and electrically connected to the active layer 143 through the second through hole 202.

In another embodiment, the display device 10 also includes a passivation layer 400. The passivation layer 400 covers the planarization layer 200, the source electrode 144, and the drain electrode 145. In the display region 11, the passivation layer 400 includes a third through hole 401. The third through hole 401 penetrates the passivation layer 400 to expose the drain electrode 145.

In another embodiment, the display device 10 also includes an anode electrode 500. The anode electrode 500 is disposed in the third through hole 401 and on the passivation layer 400. The anode electrode 500 is electrically connected to the drain electrode 145.

In another embodiment, the display device 10 also includes a cathode contact layer 600. The cathode contact layer 600 is disposed on the planarization layer 200 in the first region 13. Specifically, the cathode contact layer 600 includes a first portion 610 and a second portion 620. The first portion 610 is provided on the same layer as the active layer 143 and is disposed on the gate electrode insulating layer 142. In the first region 13, the passivation layer 400 also includes a first via 402 and a second via 403. The first via 402 penetrates the passivation layer 400 and the planarization layer 200 to expose a side of the first portion 610. The second via 403 penetrates the passivation layer 400 and the planarization layer 200 to expose the other side of the first portion 610. The second portion 620 is disposed in the first via 402 and on the second via 403 and the passivation layer 400. The second portion 620 is electrically connected to the first portion 610 through the first via 402 and the second via 403.

The pixel defining layer 300 is located in the display region 11. The pixel defining layer 300 is disposed on the planarization layer 200. Specifically, the pixel defining layer 300 is disposed on the passivation layer 400 in the display region 11. The pixel defining layer 300 includes a fourth through hole 301. The fourth through hole 301 penetrates the pixel defining layer 300 to expose the anode electrode 500.

In another embodiment, the display device 10 also includes a segregating layer 700. The segregating layer 700 is disposed on the cathode contact layer 600. The segregating layer 700 includes a plurality of fifth through holes 701. The fifth through holes 701 penetrate the segregating layer 700 to expose the cathode contact layer 600.

In the present application, the segregating layer is configured to divide the cathode contact layer into multiple regions, which prevent scratches or foreign objects in a certain region of the cathode contact layer during the preparation of the display device, so other regions can still be used normally, thereby increasing a yield of the display device and reducing production costs.

In another embodiment, the display device 10 also includes a barricade 800. The barricade 800 is disposed on the planarization layer 200 in the second region 14. The barricade is configured to prevent the mobile phase overflow before the structure of the display device is solidified.

In another embodiment, the display device 10 also includes a dam 900. The dam 900 is disposed on the planarization layer 200 in the second region 14. The dam 900 is disposed on the same layer as the barricade 800, and is located between the barricade 800 and the segregating layer 700. A height h of the dam 900 is less than a height H of the barricade 800.

In another embodiment, the display device 10 also includes a supporting structure 1000. The supporting structure 1000 is disposed on the pixel defining layer 300. The supporting structure 1000 is configured to support a structure of the display device to prevent crushing or scratching other structures in the subsequent process.

In the other embodiment, the display device 10 also includes a crack blocking dam 1100. The crack blocking dam 1100 is disposed on the planarization layer 200 in the second region 14. The crack blocking dam 1100 is located on a side of the barricade 800 away from the dam 900. The crack blocking dam is configured to prevent other structures from cracking in the subsequent process.

The protective layer 60 is located in the non-display region 12 The protective layer 60 is disposed on the planarization layer 200. Specifically, the protective layer 60 covers the passivation layer 400, the barricade 800, the dam 900, and the crack blocking dam 1100. A sum D of a height of the barricade 800 and a thickness of the protective layer 60 is greater than a height d of the supporting structure 1000. The protective layer 60 is made of diamond-like carbon. A thickness L of the protective layer 60 is 3 nanometers-980 nanometers. Specifically, in some embodiments, the thickness L of the protective layer 60 can be 4 nanometers, 6 nanometers, 8 nanometers, 10 nanometers, 206 nanometers, 700 nanometers, and 920 nanometers, etc. When the thickness L of the protective layer 60 is between 3 and 10 nanometers, the display device can be bent.

In the present application, the sum of the height of the barricade and the thickness of the protective layer is greater than the height of the supporting structure to prevent the supporting structure from being scratched or crushed during the subsequent manufacturing process or using process, and ensuring that the follow-up process or use is normal.

The protective layer is made of diamond-like carbon, so that the protective layer includes a thin hard film that can prevent water and oxygen intrusion and prevent other structures of the display device from absorbing water vapor from waiting for too long in the subsequent process, which results in water vapor being released due to heat in the subsequent process and leads to peeling off of the film.

The protective layer is made of diamond-like carbon, so that the protective layer includes a thin, scratch-resistant hard film, which can reduce encapsulation failures during the subsequent film encapsulation process caused by the barricade and the dam being crushed or scratched by the metal mask, thereby preventing water and oxygen intrusion and improving reliability and service life of the display device.

The protective layer is made of diamond-like carbon and disposed in the non-display region, which can reduce the peripheral metal circuit of the display device crushed by the foreign objects in the module process or the metal oxidation value increased by a high temperature and high humidity environment, thereby increasing a yield of the display device.

In another embodiment, the display device 10 also includes a light emitting layer 1200. The light emitting layer 1200 is disposed in the fourth through hole 301. The light emitting layer 1200 includes one of a red light emitting layer, a green light emitting layer, or a blue light emitting layer.

In another embodiment, the display device 10 also includes a cathode 1300. The cathode 1300 covers the light emitting layer 1200, the pixel defining layer 300, the supporting structure 1000, the segregating layer 700, and the fifth through hole 701. The cathode 1300 is electrically connected to the cathode contact layer 600 through the fifth through hole 701. The cathode contact layer 600 is electrically connected to the light emitting layer 1200 through the cathode 1300. The cathode contact layer 600 and the cathode 1300 form the cathode film layer 20 shown in FIG. 1. The anode electrode 500, the light emitting layer 1200, and the cathode 1300 form an organic light emitting diode.

Figure 3:
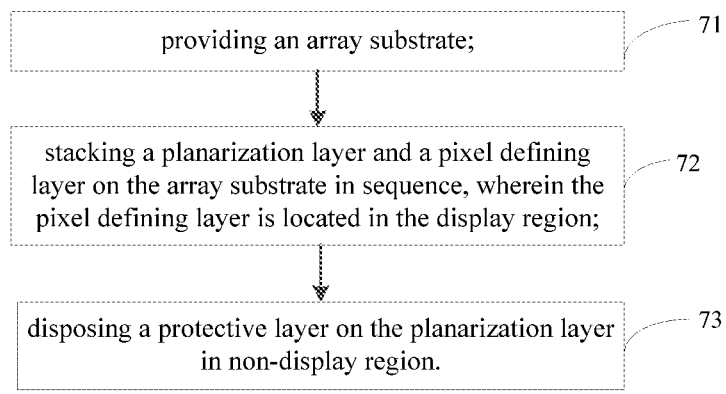
FIG. 3 is a flow chart of a method for manufacturing the display device according to the present application.

FIG. 3 is a flow chart of a method for manufacturing a display device according to the present application. The present application also provides a method for manufacturing the display device. The display device 10 includes a display region 11 and a non-display region 12. The method for manufacturing the display device includes steps as follows:

A step 71 of providing an array substrate 100.

The array substrate 100 includes a base substrate 110, a shading layer 120, a buffer layer 130, a transistor 140, and a planarization layer 200. The base substrate 110 can be polyimide or glass, etc. The shading layer 120 and the buffer layer 130 are sequentially stacked on the base substrate 110. The transistor 140 is located in the display region 11. The transistor 140 is disposed on the buffer layer 130. The transistor 140 includes a gate electrode 141, a gate electrode insulating layer 142, an active layer 143, a source electrode 144, and a drain electrode 145. The gate electrode 141 is disposed on the buffer layer 130 The gate electrode insulating layer 142 covers the gate electrode 141. The active layer 143 is disposed on the gate electrode insulating layer 142. The source electrode 144 is disposed on a side of the active layer 143 and electrically connected to the active layer 143. The drain electrode 145 is disposed on the other side of the active layer 143, and electrically connected with the active layer 143. After the active layer 143 is disposed, a first portion 610 of a cathode contact layer 600 is disposed on the gate electrode insulating layer 142 in a first region 13. The first portion 610 and the active layer 143 are disposed as the same layer.

A step 72 of stacking a planarization layer 200 and a pixel defining layer 300 on the array substrate 100 in sequence. The pixel defining layer 300 is located in the display region 11.

Specifically, a material of the planarization layer 200 is formed on the gate electrode insulating layer 142 and the active layer 143, and the material of the planarization layer 200 is etched to form the planarization layer 200. In the display region 11, the planarization layer 200 includes a first through hole 201 and a second through hole 202. The first through hole 201 penetrates the planarization layer 200 to expose a side of the active layer 143. The second through hole 202 penetrates the planarization layer 200 to expose the other side of the active layer 143. The source electrode 144 is filled in the first through hole 201 and electrically connected to the active layer 143 through the first through hole 201. The drain electrode 145 is filled in the second through hole 202 and electrically connected to the active layer 143 through the second through hole 202.

In one embodiment, after the planarization layer 200 is disposed on the array substrate 100, the method also includes:

A material of a passivation layer 400 is formed on the planarization layer 200, the source electrode 144, and the drain electrode 145, the material of the passivation layer 400 is etched to form the passivation layer 400. The passivation layer 400 includes a third through hole 401, a first via 402, and a second via 403. The third through hole 401 is defined in the display region 11. The third through hole 401 penetrates the passivation layer 400 to expose the drain electrode 145. The first via 402 and the second via 403 are defined in the first region 13. The first via 402 penetrates the passivation layer 400 and the planarization layer 200 to expose a side of the first portion 610. The second via 403 penetrates the passivation layer 400 and the planarization layer 200 to expose the other side of the first portion 610.

In one embodiment, after the passivation layer 400 is disposed on the planarization layer 200, the source electrode 144, and the drain electrode 145, the method also includes:

An anode electrode 500 is disposed in the third through hole 401 and on the passivation layer 400. The anode electrode 500 is electrically connected to the drain electrode 145.

In one embodiment, after the anode electrode 500 is disposed in the third through hole 401 and on the passivation layer 400, the method also includes:

A second portion 620 of the cathode contact layer 600 is disposed on the passivation layer 400 in the first region 13 and in the first via 402 and the second via 403. The second portion 620 is electrically connected to the first portion 610 through the first via 402 and the second via 403. The first portion 610 and the second portion 620 forms the cathode contact layer 600.

After the second portion 620 of the cathode contact layer 600 is disposed on the passivation layer 400 in the first region 13 and in the first via 402 and the second via 403, the method includes:

A pixel defining layer 300 is disposed on the planarization layer 200 in the display region 11. Specifically, a material of the pixel defining layer 300, a material of a segregating layer 700 and a material of a dam 900 are formed on the passivation layer 400 and the cathode contact layer 600. The material of the pixel defining layer 300, the material of the segregating layer 700, and the material of the dam 900 are etched to form the pixel defining layer 300, the segregating layer 700, and the dam 900. The pixel defining layer 300 is disposed on the passivation layer 400 in the display region 11. The pixel defining layer 300 includes a fourth through hole 301. The fourth through hole 301 penetrates the pixel defining layer 300 to expose the anode electrode 500. The segregating layer 700 is disposed on the cathode contact layer 600. The segregating layer 700 includes a plurality of fifth through holes 701. The fifth through holes 701 penetrate the segregating layer 700 to expose the cathode contact layer 600. The dam 900 is disposed on the planarization layer 200 in the second region 14.

In the present application, the segregating layer is configured to divide the cathode contact layer into multiple regions, which prevent scratches or foreign objects in a certain region of the cathode contact layer during the preparation of the display device, so other regions can still be used normally, thereby increasing a yield of the display device.

In one embodiment, after the pixel defining layer 300, the segregating layer 700, and the dam 900 are disposed on the passivation layer 400 and the cathode contact layer 600, the method also includes:

A material of a barricade 800 and a material of a supporting structure 1000 are formed on the pixel defining layer 300 and the passivation layer 400, and are etched to form the barricade 800 and the supporting structure 1000. The barricade 800 is disposed on the planarization layer 200 in the second region 14. The barricade is configured to prevent the mobile phase overflow before the structure of the display device is solidified. The supporting structure 1000 is disposed on the pixel defining layer 300. The supporting structure 1000 is configured to support a structure of the display device to prevent crushing or scratching other structures in the subsequent process.

After the barricade 800 and the supporting structure 1000 are disposed on the pixel defining layer 300 and the passivation layer 400, the method also includes:

A material of a crack blocking dam 1100 is formed on the planarization layer 200 in the second region 14, and the material of the crack blocking dam 1100 is etched to form the crack blocking dam 1100. The crack blocking dam 1100 is located on a side of the barricade 800 away from the dam 900. The crack blocking dam is configured to prevent other structures from cracking in the subsequent process.

A step 73 of disposing a protective layer 60 on the planarization layer 200 in the non-display region 12.

The array substrate 100, the planarization layer 200, and the pixel defining layer 300 are transferred to an oven for baking to remove the moisture adsorbed in the organic photoresist. A baking temperature is 120 degrees Celsius-250 degrees Celsius. Specifically, the baking temperature can be 125 degrees Celsius, 146 degrees Celsius, 181 degrees Celsius, and 238 degrees Celsius, etc. A baking time is 10 minutes-590 minutes. Specifically, the baking time is 17 minutes, 90 minutes, 260 minutes, 372 minutes, and 570 minutes, etc. The time will shorten with increased temperature. After removing moisture in the oven, a covering layer is formed on the array substrate 100, the pixel defining layer 300, the segregating layer 700, the cathode contact layer 600, and the supporting structure 1000. The covering layer is made of one a group selected from polyester, SiOx, and SiNx. In this embodiment, the covering layer is made of polyester. Then, it is transferred to a plasma-enhanced chemical method equipment. In the non-display region 12, a protective layer 60 is disposed on the passivation layer 400, the barricade 800, the dam 900, and the crack blocking dam 1100. A material of the protective layer 60 is diamond-like carbon. A thickness L of the protective layer 60 is 3 nanometers-980 nanometers. Specifically, in some embodiments, the thickness L of the protective layer 60 can be 4 nanometers, 6 nanometers, 8 nanometers, 10 nanometers, 206 nanometers, 700 nanometers, and 920 nanometers, etc. When the thickness L of the protective layer 60 is between 3 and 10 nanometers, the display device can be bent. After the protective layer 60 is disposed, the array substrate 100, the planarization layer 200, the pixel defining layer 300, and the protective layer 60 is sent out the plasma enhanced chemical method equipment, and the polyester protective film is removed.

After the covering layer is removed, the method includes:

A material of a light emitting layer 1200 is filled into the fourth through hole 301 to form the light emitting layer 1200. The light emitting layer 1200 includes one of a red light emitting layer, a green light emitting layer, or a blue light emitting layer.

After the light emitting layer 1200 is filled into the fourth through hole 301, the method includes:

A cathode 1300 is disposed on the light emitting layer 1200, on the pixel defining layer 300, on the supporting structure 1000, on the segregating layer 700, and in the fifth through hole 701. The cathode 1300 is electrically connected to the cathode contact layer 600 through the fifth through hole 701. The cathode contact layer 600 is electrically connected to the light emitting layer 1200 through the cathode 1300. The cathode contact layer 600 and the cathode 1300 form the cathode film layer 20 shown in FIG. 1. The anode electrode 500, the light emitting layer 1200, and the cathode 1300 form an organic light emitting diode.

In another embodiment, after removing moisture in the oven, it is not necessary to first form a polyester covering layer on the array substrate 100, the pixel defining layer 300, the segregating layer 700, the cathode contact layer 600, and the supporting structure 1000. It is firstly transferred to the plasma enhanced chemical method equipment. The patterned metal mask covering layer in the chamber is aligned with the array substrate 100, the pixel defining layer 300, the segregating layer 700, and the cathode contact layer 600. The covering layer is the metal mask in the plasma enhanced chemical method equipment. Then, in the non-display region 12, the protective layer 60 is disposed on the passivation layer 400, the barricade 800, the dam 900, and the crack blocking dam 1100. Then, it is transferred out from the plasma-enhanced chemical method equipment, and then the subsequent processes of the light emitting layer 1200 and the cathode 1300 are employed.

In the present application, the sum of the height of the barricade and the thickness of the protective layer is greater than the height of the supporting structure to prevent the supporting structure from being scratched or crushed during the subsequent manufacturing process or using process, and ensuring that the follow-up process or use is normal. The protective layer is made of diamond-like carbon, so that the protective layer includes a thin hard film that can prevent water and oxygen intrusion and prevent other structures of the display device from absorbing water vapor from waiting for too long in the subsequent process, which results in water vapor being released due to heat in the subsequent process, and leads to peeling off of the film. The protective layer is made of diamond-like carbon, so that the protective layer includes a thin, scratch-resistant hard film, which can reduce encapsulation failures during the subsequent film encapsulation process caused by the barricade and the dam being crushed or scratched by the metal mask, thereby preventing water and oxygen intrusion and improving reliability and service life of the display device. The protective layer is made of diamond-like carbon and disposed in the non-display region, which can reduce the peripheral metal circuit of the display device crushed by the foreign objects in the module process or the metal oxidation value increased by a high temperature and high humidity environment, thereby increasing a yield of the display device.

The present application provides a display device and a method for manufacturing the display device. The display device includes a display region and a non-display region. The display device includes an array substrate, a planarization layer, a pixel defining layer, and a protective layer. The planarization layer is disposed on the array substrate. The pixel defining layer is located in the display region. The pixel defining layer is disposed on the planarization layer. The protective layer is located in the non-display region. The protective layer is disposed on the planarization layer. In the present application, the protective layer is disposed on the planarization layer in the non-display region to prevent water and oxygen from intruding the display device, and prevent the structure in the display device from being scratched without affecting the subsequent manufacturing process, thereby improving the reliability of the display device.

What is claimed is:

1. A display device, wherein the display device comprises a display region and a non-display region, and the display device further comprises:
   an array substrate;
   a planarization layer disposed on the array substrate;
   a pixel defining layer located in the display region, wherein the pixel defining layer is disposed on the planarization layer, the non-display region comprises a first region and a second region, the first region is located near the pixel defining layer, the second region is located away from the pixel defining layer;
   a cathode contact layer disposed on the planarization layer in the first region;
   a segregating layer disposed on the cathode contact layer, wherein the segregating layer comprises a plurality of through holes penetrating the segregating layer to expose the cathode contact layer, and the segregating layer is configured to divide the cathode contact layer into multiple regions; and
   a protective layer located in the non-display region rather than the display region, wherein the protective layer is disposed on the planarization layer.

2. The display device of claim 1, wherein the protective layer is made of diamond-like carbon.

3. The display device of claim 1, wherein a thickness of the protective layer ranges from 3 nanometers to 980 nanometers.

4. The display device of claim 1, wherein the display device further comprises a supporting structure, and the supporting structure is disposed on the pixel defining layer.

5. The display device of claim 4, wherein the display device further comprises a barricade, the barricade is disposed on the planarization layer in the second region, the protective layer covers the barricade, and a sum of a height of the barricade and a thickness of the protective layer is greater than a height of the supporting structure.

6. The display device of claim 5, wherein the display device further comprises a dam, and the dam is disposed on the planarization layer in the second region, a height of the dam is less than a height of the barricade.

7. The display device of claim 5 wherein the display device further comprises a crack blocking dam, and the crack blocking dam is disposed on the planarization layer in the second region, the crack blocking dam is located on a side of the barricade away from the dam.

* * * * *